United States Patent [19]
Itaya et al.

[11] Patent Number: 4,845,691
[45] Date of Patent: Jul. 4, 1989

[54] GROUP DELAY TIME MEASUREMENT APPARATUS WITH AUTOMATIC APERTURE VALUE SETTING FUNCTION

[75] Inventors: Hiroshi Itaya, Isehara; Takehiko Kawauchi, Ayase, both of Japan

[73] Assignee: Anritsu Corporation, Tokyo, Japan

[21] Appl. No.: 200,699

[22] Filed: May 31, 1988

[30] Foreign Application Priority Data

Jun. 2, 1987 [JP] Japan .................................. 62-137729

[51] Int. Cl.$^4$ .............................................. G04F 8/00
[52] U.S. Cl. .................................. 368/120; 324/77 C; 324/77 A
[58] Field of Search ................................ 368/113–120; 324/77 A, 77 CS, 73 12, 73 AT, 73 PC; 364/485

[56] References Cited

U.S. PATENT DOCUMENTS

| | | | |
|---|---|---|---|
| 4,244,024 | 1/1981 | Marzalek et al. | 324/77 B |
| 4,274,047 | 6/1981 | Hecken | 327/57 R |
| 4,611,164 | 9/1986 | Mitsuyoshi et al. | 364/485 |
| 4,669,051 | 5/1987 | Barr | 324/77 A |

FOREIGN PATENT DOCUMENTS

58-10711 2/1983 Japan .
2154751 1/1985 United Kingdom .

Primary Examiner—Bernard Roskoski
Attorney, Agent, or Firm—Frishauf, Holtz, Goodman & Woodward

[57] ABSTRACT

A frequency converter receives a signal to be measured and a local oscillation signal supplied from a local oscillator and ouputs an intermediate frequency signal. A phase detector detects a phase of the intermediate frequency signal. An A/D converter outputs a digital value corresponding to a phase detection output. A memory stores a plurality of aperture values. Each of the aperture values is read out with a predetermined frequency band which is incremented at a predetermined step. A first controller causes the local oscillator to oscillate signals having first and second frequencies separated from each other by the aperture value in the vicinity of a desired measurement frequency. An arithmetic unit calculates a group delay time of the signal to be measured in accordance with the two digital values and the aperture value corresponding to the respective phase detection outputs when the local oscillator oscillates the signals having the first and second frequencies. A second controller causes the memory to start or to stop reading and incrementing the aperture value when the group delay time is determined to be smaller or larger than a reference value.

15 Claims, 6 Drawing Sheets

| SETTING RANGE NUMBER | ΔF (APERTURE) |
|---|---|
| 0 | 1 Hz |
| 1 | 2 Hz |
| 2 | 4 Hz |
| 3 | 10 Hz |
| 4 | 20 Hz |
| 5 | 40 Hz |
| ⋮ | ⋮ |
| n | ΔFn |
| ⋮ | ⋮ |
| K | ΔFK (4 MHz) |

GROUP DELAY TIME MEASUREMENT APPARATUS WITH AUTOMATIC APERTURE VALUE SETTING FUNCTION

BACKGROUND OF THE INVENTION

1. Field of the Invention

This invention generally relates to a delay measurement apparatus and, more particularly, to a group delay time measurement apparatus with an automatic aperture value setting function.

This invention broadly relates to an apparatus for measuring a group delay time (to be merely referred to as a delay hereinafter where it is not misleading) of a general electric circuit network.

In particular, a phase gradient scheme is conventionally known as a scheme to use two signals having different frequencies and to measure a group delay time from a phase difference in the two frequency outputs. In group delay time measurement based on the phase gradient scheme, a frequency difference (which is called an aperture value) of two signals having different frequencies is set at the optimum value in accordance with an object to be measured, e.g., an electric circuit network, an electric component, or the like. This invention relates to a group delay time measurement apparatus (or merely a delay apparatus) with an automatic aperture value setting function which can automatically set the aperture value at the optimum value.

2. Description of the Related Art

As a means for measuring a group delay time of an electric circuit network, the Nyquist scheme that uses AM or FM waves, the phase gradient scheme that uses a sweep frequency signal and differentiates the phase characteristics of the sweep frequency signal, the phase gradient scheme that uses two signals having different frequencies and performs measurement from a phase difference between the two signals, and so on are available.

Figure 1:
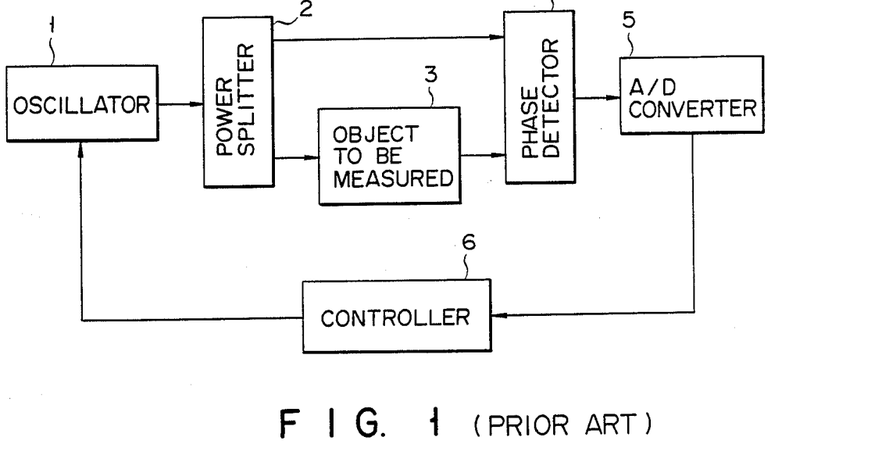
FIG. 1 is a block diagram of an example of a conventional group delay time measurement apparatus.

FIG. 1 is a block diagram of an example of a measurement apparatus based on the phase gradient scheme and disclosed in Japanese Patent Publication No. 58-10711 as a prior art. As shown in FIG. 1, a signal output from oscillator 1 is split by power splitter 2 into two paths. One of the split signals is input to phase detector 4 through object 3 to be measured such as an electric circuit network, while the other of the split signals is directly input to phase detector 4. Detector 4 detects the phase difference between the two input signals. A detected phase difference signal is converted into a digital signal by A/D (analog/digital) converter 5 and is output. When measurement is completed, oscillator 1 outputs a signal having a frequency different from that of the signal originally output by oscillator 1 under the control of controller 6. The output signal is supplied to A/D converter 5, thus obtaining a digital phase difference signal. Assuming that the voltages of the signals measured in the above manner are V1 and V2, and that the frequency difference of the signals output from oscillator 1 is Δf, group delay time D is indicated as follows:

$$D \propto (V2 - V1)/\Delta f$$

Note that $D = d\phi/d\omega$ where $\phi$ is the signal phase shift between Δf and ω is the angular frequency. As a result, the apparatus having the above arrangement can easily obtain group delay time from a phase shift component of object 3 at different frequencies.

Figure 2:
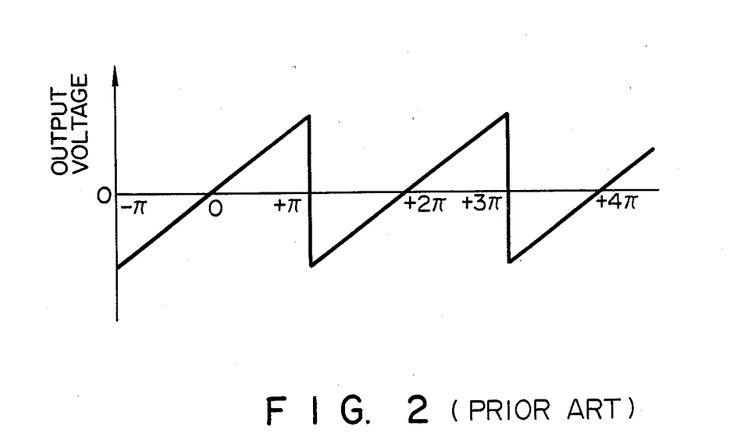
FIG. 2 is graph showing a detection range of a phase detector shown in FIG. 1.

However, such a conventional apparatus has the following problems. More specifically, the detection range of phase detector 4 is generally $-\pi$ to $+\pi$. Therefore, when a phase shift component falls outside this range, it must be corrected as shown in FIG. 2. When measured values are located at, e.g., two sides of $+\pi$, i.e., are discontinuous as shown in FIG. 2, the calculation for obtaining group delay time D becomes very complicated. Even when the precision of the output voltage with respect to the phase difference of phase detector 4 is improved to have an error falling only within a range of ±1%, if measurement is performed for the discontinuous points, the resultant precision has an error falling within a range of $(2\pi \times 1)$ %, thus increasing the error. Although the precision having an error of $(2\pi \times 1)$ % is very high in the conventional apparatus, it is insufficient as a precision of a group delay time.

Figure 3:
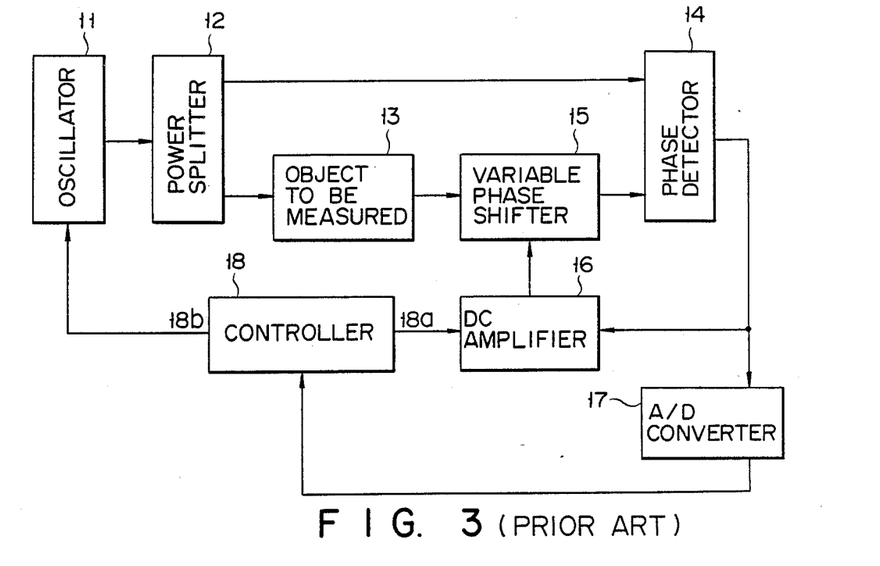
FIG. 3 is a block diagram of another conventional time delay measurement apparatus.

FIG. 3 shows a group delay measurement apparatus disclosed in Japanese Patent Publication No. 58-10711 to eliminate the drawbacks of the conventional apparatus described above.

Referring to FIG. 3, a signal output by oscillator 11 is split by power splitter 12 into two signals. One split signal is supplied to object 13 to be measured while the other split signal is supplied to one input terminal of phase detector 14. The signal supplied to object 13 is output to variable phase shifter 15 to be phase-controlled and then supplied to the other input terminal of phase detector 14. Detector 14 detects a phase difference between the two signals and outputs a detection signal. The detection signal is supplied to the signal input terminal of DC amplifier 16 serving as a phase controller for controlling the phase shifting of phase shifter 15. The detection signal is also converted into a digital signal by A/D converter 17, and the digital signal is applied to controller 18. Upon reception of the digital signal, controller 18 outputs a holding signal to DC amplifier 16 from output terminal 18a and a frequency control signal to oscillator 11 from output terminal 18b.

A signal having a frequency (f−Δf/2) is supplied to the apparatus having the above arrangement through oscillator 11. Phase detector 14 detects a phase difference between a signal obtained through object 13 and a signal from oscillator 11 and outputs a signal corresponding to the phase difference. The phase difference signal is negatively fed back to variable phase shifter 15 through DC amplifier 16. Phase shifter 15 controls the phase shift of the signal output from object 13 such that a phase difference between the signal output from object 13 and the signal supplied form oscillator 11 becomes zero. As a result, a zero signal is output from phase detector 14. The zero signal is supplied to controller 18 through A/D converter 17. Upon reception of the digital zero signal, controller 18 stops negative feedback to phase shifter 15 performed by amplifier 16 to hold the phase shift control value obtained by phase shifter 15, while it also supplies a signal to oscillator 11. Upon reception of the signal, oscillator 11 outputs a signal having a frequency (f+Δf/2), and phase detector 14 detects a phase difference between the signal output from oscillator 11 and the signal supplied through object 13. In this case, negative feedback by amplifier 16 is stopped in the manner as described above. Therefore, phase shifter 15 performs phase shift control of the signal supplied through object 13 at the phase shift control value set in advance for a frequency (f−Δf/2). Therefore, phase detector 14 outputs a signal corresponding to the phase shift of object 13 for a frequency change component $$(f+\Delta f/2)-(f-\Delta f/2)=\Delta f$$

In this manner, with this apparatus, a phase difference detected by phase detector 14 for the frequency (f−Δf/2) is controlled to be zero, and under this condition a phase difference is detected for the frequency (f+Δf/2). Therefore, with this apparatus, since phase difference detection is performed constantly with respect to a phase difference of zero as a reference, the detection range can normally be ±π. Phase difference detection for discontinuous points is not performed unlike in the conventional case, and continuous detection can be constantly performed in the vicinity of the center of the detection range. The error in the measured signal depends only on the error of phase detector 14, e.g., 1%, and the measurement precision can be maintained as high as 1%.

Figure 4:
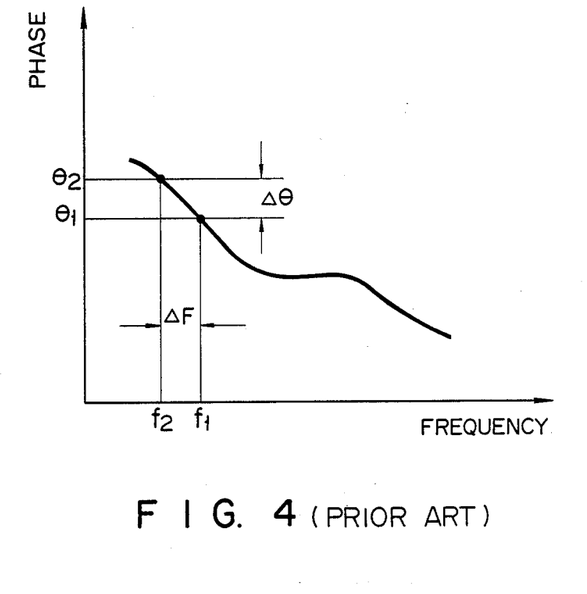
FIG. 4 is a graph of phase characteristics for explaining a differential of phase gradient.

When a delay of an object to be measured is to be measured by a network analyzer using a group delay measurement apparatus based on the phase gradient scheme described above, an aperture value is set. As is known, a delay is obtained by calculating a differential of a phase gradient of phase characteristics. More specifically, referring to the graph shown in FIG. 4, when the phases for two different frequencies $f_1=f_0+\Delta F/2$ and $f_2=f_0-\Delta F/2$ are set at $\theta_1$ and $\theta_2$, respectively, delay time $\tau$ can be obtained in accordance with the following equation:

$$\tau=d\theta/d\omega=\Delta\theta/2\pi\cdot\Delta F=\Delta\theta/360°\cdot\Delta F \quad (1)$$

where $\theta$ is a phase shift, $\omega$ is an angular frequency, $\Delta\theta$ is a differential phase value, and $\Delta F$ is a differential frequency value (aperture value).

As is apparent from equation (1), when differential phase value $\Delta\theta$ is constant, the larger aperture value $\Delta F$, i.e., the wider the aperture, the narrower the measurement range of delay $\tau$; the narrower the aperture (the smaller aperture value $\Delta F$), the wider the measurement range of delay $\tau$. Thus, the delay measurement range is automatically determined in accordance with aperture value $\Delta F$.

Figure 5:
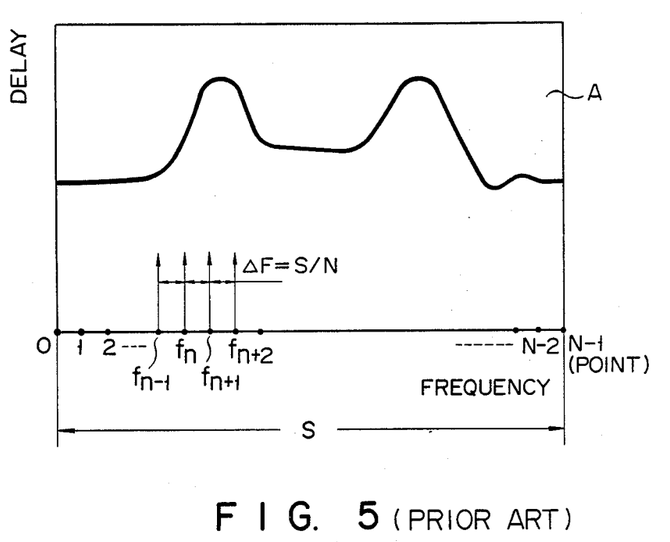
FIG. 5 shows a display screen for explaining aperture setting in conventional delay measurement.

In conventional delay measurement using, e.g., the network analyzer as described above, aperture value $\Delta F$ is uniquely determined by a measurement frequency range set in the measuring device before measurement. More specifically, referring to FIG. 5, since number N of display pixels of display screen A in the horizontal direction is determined to be, e.g., 512, this number corresponds to number N of measurement points. Therefore, when measurement frequency range S set in the measuring device is determined, the frequency among measurement points $f_{n-1}$, $f_n$, $f_{n+1}$, and $f_{n+2}$ is uniquely determined at S/N.

In the conventional measuring device, the frequency indicated as S/N is directly used and set as aperture value $\Delta F$. In other words, when measurement frequency range S is determined, aperture value $\Delta F=S/N$ is automatically set, and the delay range is accordingly set, as is apparent from equation (1).

Figure 6:
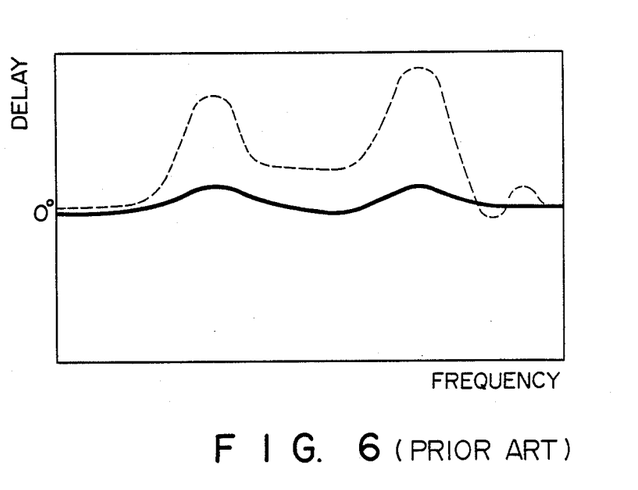
FIG. 6 shows a display screen for explaining delay characteristics display according to the conventional method.

However, with the conventional method, aperture value $\Delta F$ is determined regardless of an object to be measured, and an optimum aperture for the object to be measured is not determined. This is because the values of delay differ depending on objects to be measured even when measurement is performed in the same frequency band. For example, in measurement of filter delay characteristics, one filter has a very high Q value like a quartz filter, and another filter has a very low Q value like an LCR filter. The phase gradients of their phase characteristics differ depending on the objects to be measured. When aperture value $\Delta F$ is set to be narrow where the actual delay characteristics are as indicated by the broken line, as in FIG. 6. Thus, the mountain-like portions of the graph exceeding $\pi$ collapse and the resultant delay graph becomes as indicated by the solid line. When wide aperture value $\Delta F$ is always set in order to eliminate this drawback, phase inversion occurs at $\theta=\pi$ a wide dynamic range cannot be obtained. Therefore, wide aperture value $\Delta F$ cannot always be set. In this manner, with the conventional method, an optimum aperture for an object to be measured is not set. With the aperture value set in accordance with the conventional method, some objects cannot be measured.

SUMMARY OF THE INVENTION

It is, therefore, an object of the present invention to provide a new and improved group delay time measurement apparatus with an automatic aperture value setting function which measures a delay at a given point in time during which an aperture value is changed, and wherein an aperture value which provides a maximum delay can be obtained, thereby automatically detecting, in accordance with an object to be measured, an optimum aperture.

According to the present invention, there is provided a group delay time measurement apparatus comprising:

means for inputting a signal to be measured;

local oscillating means for oscillating a local oscillation signal having a predetermined frequency;

frequency converting means for receiving the signal to be measured and the local oscillation signal from the signal input means and the local oscillating means respectively and outputting an intermediate frequency signal;

phase detecting means, connected to the frequency converting means, for detecting a phase of the intermediate frequency signal;

A/D converting means for receiving a phase detection output supplied from the phase detecting means and outputting a corresponding digital value;

aperture value storage means for storing a plurality of aperture values, each of the aperture values being read out by a predetermined frequency band which is incremented at a predetermined step, respectively;

measurement frequency setting means for setting a desired measurement frequency;

first control means for receiving an aperture value from the aperture value storage means and the desired measurement frequency from the measurement frequency setting means and causing the local oscillating means to oscillate signals having first and second frequencies, the signals being separated from each other by the aperture value in the vicinity of the desired measurement frequency;

arithmetic means, coupled to the A/D converting means and the aperture value storage means, for calculating a group delay time of the signal to be measured in accordance with the aperture value and two digital values which correspond to the respective phase detection outputs supplied from the phase detecting means when the local oscillating means oscillates the signals having the first and second frequencies;

determination means for determinating whether an output from the arithmetic means, concerning the group delay time, is larger than a predetermined reference value; and second control means, coupled to the measurement frequency setting means and the determination means, for causing the aperture value storage means to start reading and incrementing the aperture value in accordance with the desired measurement frequency at the time of initialization and when the output concerning the group delay time has been determined to be smaller than the reference value, and for causing the aperture value storage means to stop reading and incrementing the aperture value when the output concerning the group delay time has been determined to be larger than the reference value.

BRIEF DESCRIPTION OF THE DRAWINGS

These and other objects and features of the present invention can be understood through the following embodiments by reference to the accompanying drawings, in which.

DETAILED DESCRIPTION OF THE PREFERRED EMBODIMENTS

The principle of the present invention will first be briefly described. The phase gradient scheme is employed in the delay measurement apparatus of the present invention. Phase values $\theta_1$ and $\theta_2$ at positions separated from each other by aperture value $\Delta F$ are detected as the two phases used for calculating the phase difference. Values $\theta_1$ and $\theta_2$ are converted into digital values so that they can be subjected to an arithmetic operation using a microprocessor.

A frequency oscillated by a local oscillator is mixed with a frequency of a signal to be measured which has passed through a circuit, a delay time of which is to be measured, to obtain an intermediate frequency signal. Thus, the calculation of phase values at positions which are separated from each other by $\Delta F$ becomes easy.

Alternatively, a delay can be calculated from the difference between the phase values and $\Delta F$.

The aperture value is preferably set to be as large as possible in order to improve the measurement precision. Regarding a reference value used for determining a high aperture value, it is determined at a maximum value where $|\Delta\theta|$ does not exceed $\pi$. The same concept is applied to a delay.

An aperture table is prepared to gradually increase an aperture value to be approximately that of the discrimination reference value. It is preferable that values on this table are increased by an exponential function of 2 in order to facilitate digital processing. In practice, however, values which approximate the exponential function of 2 may be used.

When an increase of $\Delta F$ is stopped at a point where $|\Delta\theta|$ is approximately that of $\pi$ or where a delay corresponding to $\Delta\theta$ is obtained from $\Delta\theta$ (where $|\Delta\theta|\approx\pi$ and $|\Delta\theta|<\pi$) and $\Delta F$, an optimum aperture value can be set. A means for automatically setting such an optimum aperture value is provided.

For this purpose, the group delay time measurement apparatus with an automatic aperture value setting function in delay measurement according to the present invention has a frequency converter, a phase detector, a measurement frequency setting unit, an aperture table, a local oscillation signal controller, an arithmetic unit, and a discrimination unit. The frequency converter mixes a local oscillation signal oscillated by a local oscillator with an input signal to be measured, thus obtaining an intermediate frequency signal. The phase detector detects a phase of the intermediate frequency signal supplied from the intermediate frequency converter. The measurement frequency setting unit receives desired measurement frequency f0 of the signal waveform to be measured. The aperture table stores, in advance, aperture values $\Delta F_n$ assigned to corresponding set ranges n in order to set optimum aperture value $\Delta F$ in accordance with an object to be measured. The local oscillation frequency controller controls the frequency oscillated by the local oscillator at $f_0-\Delta F_n/2$, and $f_0+\Delta F_n/2$ by using desired measurement frequency $f_0$, input into the measurement frequency setting unit, and aperture value $\Delta F_n$ read out from the aperture table. The arithmetic unit calculates delay $\tau n$ of the signal to be measured from outputs $\theta_2$ and $\theta_1$ of the phase detector when the frequencies oscillated by the local oscillator are $f_0-\Delta F_n/2$ and $f_0+\Delta F_n/2$, respectively. When delay time $\tau_n$ calculated by the arithmetic unit is larger than a predetermined value, the discrimination unit determines the corresponding value $\Delta F_n$ as the aperture value. When delay time $\tau_n$ is smaller than the predetermined value, the discrimination unit causes the aperture table to read out aperture value $\Delta F_{n+1}$ assigned to next set range n+1. An optimum aperture of an object to be measured can thus be automatically detected and set in accordance with the object.

Several embodiments of the present invention will be described with reference to the accompanying drawings.

First Embodiment

Figure 7:
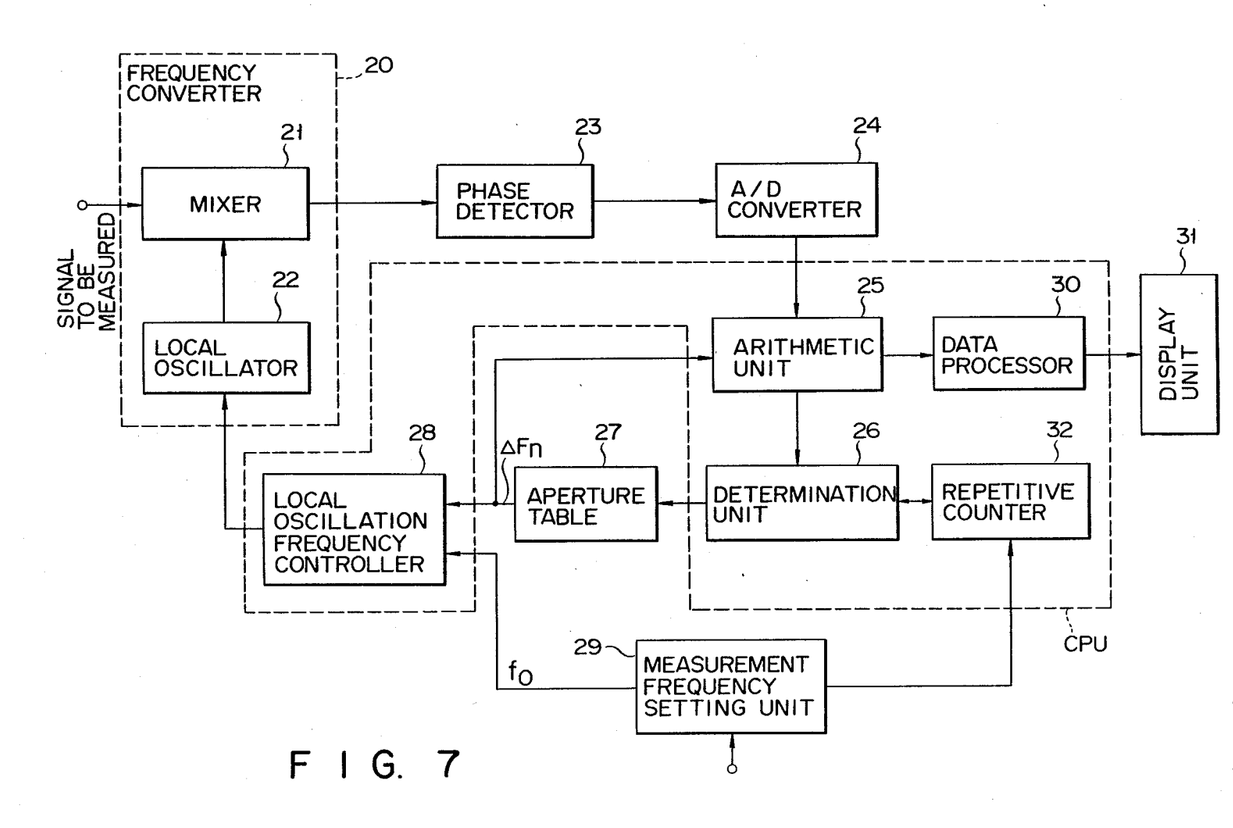
FIG. 7 is a block diagram of a group delay measurement apparatus with an automatic aperture setting function according to an embodiment of the present invention.
Figure 8:
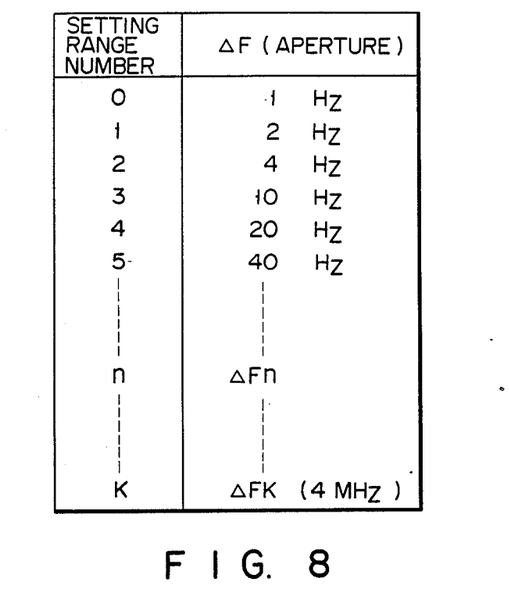
FIG. 8 shows aperture values assigned to the respective set ranges stored in the aperture table shown in FIG. 7.
Figure 9:
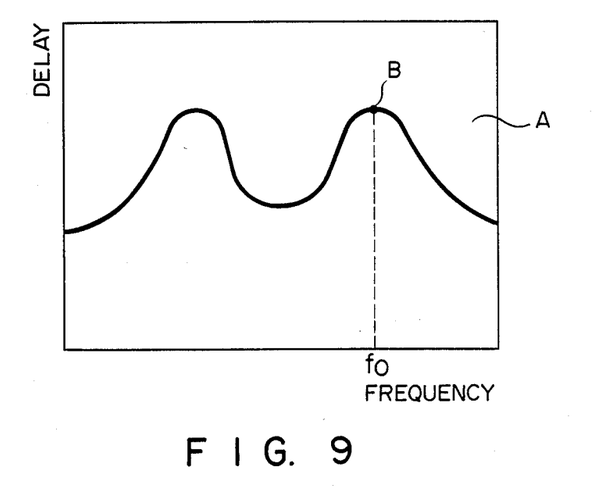
FIG. 9 is a graph of desired measurement frequency f0 input through the measurement frequency input section shown in FIG. 7.
Figure 10:
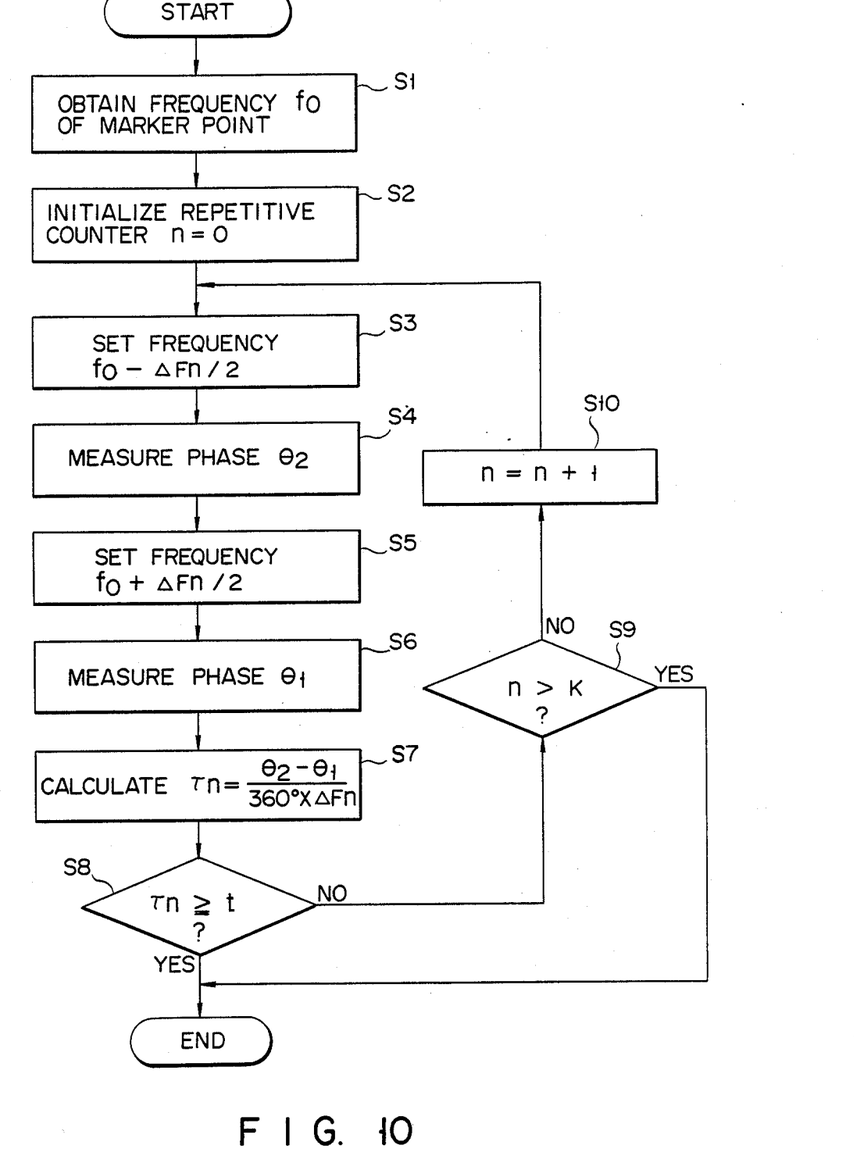
FIG. 10 is a flow chart for explaining the operation of the apparatus shown in FIG. 7.

FIG. 7 is a block diagram of a group delay time measurement apparatus with an automatic aperture value setting function according to an embodiment of the present invention. FIG. 8 shows examples of aperture values assigned to the set ranges stored in the aperture table shown in FIG. 7. FIG. 9 is a graph for explaining desired measurement frequency f0 input through the measurement frequency setting unit shown in FIG. 7. FIG. 10 is a flow chart for explaining the operation of the apparatus shown in FIG. 7.

Referring to FIG. 7, frequency converter 20 has mixer 21 and local oscillator 22. The apparatus also has phase detector 23, A/D converter 24, arithmetic unit 25, determination unit 26, aperture table 27, local oscillation frequency controller 28, measurement frequency setting unit 29, data processor 30, and display unit 31. Arithmetic unit 25, determination unit 26, local oscillation frequency controller 28, and data processor 30 can be included in microprocessor CPU.

A measurement signal input through an object to be measured, e.g., an electric circuit network and an electric component, is converted into an intermediate frequency (IF) signal by mixer 21 of frequency converter 20 by a signal oscillated by local oscillator 22, and then input to phase detector 23. Assume that when the aperture value is $\Delta F_n$ and the oscillation frequencies from oscillator 22 are $f_0 - \Delta F_n/2$ and $F_0 + \Delta F_n/2$, the outputs from detector 23 are $\theta_2$ and $\theta_1$, respectively, where $f_0$ is a desired measurement frequency input through measurement frequency setting unit 29 and is set at a value which is approximately that of a frequency to be monitored, and $\Delta F_n$ is the aperture value assigned to set range number n read out from aperture table 27. This will be described later in detail.

Furthermore, phase detector 23 operates as described in FIG. 3, and has an original phase detector section, a DC amplifier, and a variable phase shift section. Functions of the A/D converter and controller in FIG. 3, may be taken for those of A/D converter 24 and oscillation frequency controller 28. Thus, although a phase difference of $\theta_2 - \theta_1$ can be measured, it still becomes $\pm \pi$. If phase detector 23 operates to measure within a small range of $\theta_2$ and $\theta_1$, it is then unnecessary for phase detector 23 to have the described above functions.

Arithmetic unit 25 calculates delay time $\tau_n$ from outputs $\theta_2$ and $\theta_1$, output from phase detector 23, and corresponding aperture value $\Delta F_n$ read out from aperture table 27 when oscillation frequencies of local oscillator 22 are $f_0 - \Delta F_n/2$ and $f_0 + \Delta F_n/2$ in accordance with the following equation:

$$\tau_n = (\theta_2 - \theta_1)/(360° \times F_n) \quad (2)$$
$$= \Delta\theta/(360° \times \Delta F_n)$$

Determination unit 26 compares delay $\tau_n$ calculated by arithmetic unit 25 with predetermined determination value t, e.g., a measured value ½ or 1/2.5 that of the delay range. Value t as a reference value is set such that phase difference $\Delta\theta$ is a maximum value not exceeding $\pm \pi$. If $\tau_n \geq t$, current aperture value $\Delta F_n$ read out from aperture table 27 is determined to be optimum aperture value $\Delta F$ for the object to be measured. However, if $\tau_n < t$, discrimination unit 25 outputs a signal to read out, from aperture table 27, aperture value $\Delta F_{n+1}$ assigned to the next set range number n+1.

Aperture table 27 stores, in advance, aperture values $\Delta F_n$ assigned to set range numbers n, as shown in FIG. 8. FIG. 8 shows an example of the aperture table. Maximum set range number K and a corresponding aperture value are arbitrarily set by a measurement device and stored such that the larger the set range n, the larger the aperture value will be, as will be described below. In this example, the aperture values are 1, 2, 4, 10, 20, 40, 100, 200, and 400 Hz; 1, 2, 4, 10, 20, 40, 100, 200, and 400 kHz; and 1, 2, and 4 MHz which are exponentially increased, to increment a set range of numbers.

Measurement frequency setting unit 29 receives desired measurement frequency $f_0$. When the object to be measured is a filter, the central frequency of the filter is selected as desired measurement frequency $f_0$. When the object to be measured is found to have unknown delay time characteristics by scanning and measuring the measurement frequency with measurement frequency setting unit 29, they are displayed on display screen A as a curve, as shown in FIG. 9. A marker point for reading the frequency is set at the peak value of the curve, thereby obtaining desired measurement frequency $f_0$. In this case, the characteristics curve does not represent a measurement of an optimum condition, however measurement frequency $f_0$ of the delay characteristics does obtain a desired measurement frequency.

Local oscillation frequency controller 28 outputs a control signal to local oscillator 22 so that local oscillator 22 outputs two different oscillation frequencies $f_0 - \Delta F_n/2$ and $f_0 + \Delta F_n/2$, based on desired measurement frequency $f_0$ input from frequency setting unit 29, and aperture value $\Delta F_n$ read out from aperture table 27.

The operation of the apparatus of FIG. 7 will be described using a flowchart of FIG. 10.

Desired measurement frequency $f_0$ is input from measurement frequency setting unit 29. When round solid marker point B is set at the peak position of the delay curve on display screen A shown in FIG. 9, the frequency at marker point B, i.e., measurement frequency $f_0$ is obtained (step 1). In step 2, microprocessor CPU initializes internal repetitive counter 32 to read out an aperture value of 1 Hz assigned to set range number 0, and reads out aperture value $\Delta F_0 = 1$ Hz assigned to set range 0 from aperture table 27. In step 3, local oscillation frequency controller 28 outputs a control signal to local oscillator 22 so that local oscillator 22 outputs oscillation frequency $f_0 - \Delta F_0/2 = f_0 - \frac{1}{2}$, based on measurement frequency f0 input from frequency setting unit 29, and aperture value $\Delta F_0 = 1$ Hz read out from aperture table 27. In step 4, local oscillator 22 outputs a signal having an oscillation frequency $f_0 - \Delta F_0/2$, and thus an output, i.e., phase $\theta_2$ is obtained from phase detector 23. Output $\theta_2$ is digitized by A/D converter 24 and input to arithmetic unit 25. Subsequently, frequency controller 29 outputs a control signal in step 5 to local oscillator 22 so that local oscillator 22 outputs an oscillation frequency $f_0 + \Delta F_0/2 = f_0 + \frac{1}{2}$. In step 6, oscillator 22 outputs a signal having an oscillation frequency $f_0 + \Delta F_0/2$, and thus an output, i.e., phase $\theta_1$, is obtained from phase detector 23. Output $\theta_1$ is digitized by converter 24 and input to arithmetic unit 25. Arithmetic unit 25 also receives aperture value $\Delta F_0 = 1$ Hz, read out from aperture table 27 and assigned to set range 0, and executes calculation of equation (2), i.e., $$\pi_0 = (\theta_2 - \theta_1)/(360° \times F_0) = \Delta\theta/(360° \times 1).$$

The calculation result is supplied to determination unit 26. In step 8, determination unit 26 discriminates a larger one between $\pi_0$ supplied from arithmetic unit 25 and predetermined determination value t, i.e., a measured value ½ the delay range. If $\theta_0 < t$, a control signal is output from determination unit 26 to aperture table 27 through counter 32 in steps 9 and 10 to read out aperture value $\Delta F_1 = 2$ Hz assigned to next set range 1. As a result, the aperture value assigned to set range 1 is incremented and value $F_1 = 2$ Hz is read out from aperture table 27. Then, signals having oscillation frequencies $f_0 - \Delta F_1/2 = f_0 - 1$ and $f_0 + \Delta F_1/2 = f_0 + 1$ are output from local oscillator 22, and corresponding phases $\theta_2$ and $\theta_1$ for frequencies $f_0 - \theta F_1/2$ and $f_0 + \theta F_1/2$ are obtained from phase detector 23. $\tau_1$ is calculated by arithmetic unit 25 from phases $\theta_2$ and $\theta_1$ and aperture value $\Delta F_1$ read out from aperture table 27 in accordance with the following equation:

$$\tau_1 = (\theta_2 - \theta_1)/(360° \times \Delta F_1) = \Delta\theta/(360° \times 2).$$

Determination unit 26 compares $\tau_1$ and determination value t. If $\tau_1 < t$, steps 3 to 10 are repeated.

In step 8, if $\tau_n \geq t$ is obtained by determination unit 26 when aperture value $\Delta F$ assigned to set range number n is read out from aperture table 27, corresponding aperture value $\Delta F_n$ assigned to current set range number n is determined to be optimum aperture value $\Delta F$ for the object to be measured, and value $\Delta F_n$ is set in the measurement device.

The aperture values are sequentially read out from aperture table 27 down to value $\Delta F_k$ assigned to set range number K. If $\tau_k < t$, value $\Delta F_k$ assigned to corresponding set range K is determined to be optimum aperture value $\Delta F$ for the object to be measured (step 9).

In this manner, when desired frequency $f_0$ is set by measurement frequency setting unit 29, optimum aperture value $\Delta F$ of the object to be measured is automatically detected and set in the measurement device.

Referring to FIG. 7, recent devices used as A/D converter 24 have a high conversion speed. Therefore, converter 24 can also serve as phase detector 23. In this case, it is not necessary that a separate phase detector 23 be provided. However, even when converter 24 serves as detector 23, a phase difference between two different frequencies must be obtained, as is apparent from the above description. Therefore, a phase detector is substantially needed.

Second Embodiment

The first embodiment can be modified in the following manner. More specifically, aperture value $\Delta F$ is gradually increased until a difference between measured phase values $\theta_1$ and $\theta_2$ of two frequencies and $f_2$ separated from each other by aperture value $\Delta F$ — becomes a maximum value not exceeding $\pm\pi$.

In this embodiment, arithmetic unit 25 need only calculates difference $\Delta\theta$ between $\theta_1$ and $\theta_2$, as opposed to executing a calculation of equation (1). In this case, an aperture value prior to one providing $|\Delta\theta| > \pi$ by one step can be set.

As described above, according to the present invention, an optimum aperture value can be automatically detected and set in accordance with an object to be measured. Therefore, high-precision delay time measurement can be performed.

What is claimed is:

1. A group delay time measurement apparatus comprising:
   means for inputting a signal to be measured;
   local oscillating means for oscillating a local oscillation signal having a predetermined frequency;
   frequency converting means for receiving the signal to be measured supplied from said signal input means and the local oscillation signal supplied from said local oscillating means and outputting an intermediate frequency signal;
   phase detecting means, connected to said frequency converting means, for detecting a phase of the intermediate frequency signal;
   analog to digital converting means for receiving a phase detection output supplied from said phase detecting means and outputting a corresponding digital value;
   aperture value storage means for storing a plurality of aperture values, each of the aperture values being read out by a predetermined frequency band which is incremented at a predetermined step, respectively;
   measurement frequency setting means for setting a desired measurement frequency;
   first control means for receiving an aperture value from said aperture value storage means and the desired measurement frequency from said measurement frequency setting means and causing said local oscillating means to oscillate signals having first and second frequencies, the signals being separated from each other by the aperture value in the vicinity of the desired measurement frequency;
   arithmetic means, coupled to said analog to digital converting means and said aperture value storage means, for calculating a group delay time of the signal to be measured in accordance with the aperture value and two digital values which correspond to the respective phase detection outputs supplied from said phase detecting means when said local oscillating means oscillates the signals having the first and second frequencies;
   determination means for determinating whether an output concerning the group delay time from said arithmetic means is larger than a predetermined reference value; and
   second control means, coupled to said measurement frequency setting means and said determination means, for causing said aperture value storage means to start reading and incrementing the aperture value in accordance with the desired measurement frequency at the time of initialization and when the output concerning the group delay time has been determined to be smaller than the reference value, and causing said aperture value storage means to stop reading and incrementing the aperture value when the output concerning the group delay time has been determined to be larger than the reference value.

2. An apparatus according to claim 1, wherein the predetermined reference value is selected such that a phase difference between the two digital values is a maximum value not exceeding $\pm\pi$.

3. An apparatus according to claim 1, wherein the aperture value stored in said aperture storage means is incremented as an exponential function of 2.

4. An apparatus according to claim 1, wherein said second control means includes a repetitive counter which is set at zero upon initialization and is sequentially incremented.

5. An apparatus according to claim 1, wherein said apparatus further comprises:
   data processing means for receiving an output from said arithmetic means and performing predetermined processing; and
   display means for displaying an output from said data processing means.

6. An apparatus according to claim 5, wherein the desired measurement frequency set by said measurement frequency setting means is obtained by setting a frequency reading marker point at a peak value of a curve displayed on said display means and representing the measurement signal.

7. An apparatus according to claim 1, wherein the first and second frequencies oscillated by said local oscillating means are $f_0 - \Delta F/2$, and $f_0 + \Delta F/2$, respectively, where $f_0$ is the measurement frequency and $\Delta F$ is the aperture value.

8. An apparatus according to claim 1, wherein the aperture value includes 1, 2, 4, 10, 20, 40, 100, 200, and 400 Hz; 1, 2, 4, 10, 20, 40, 100, 200, and 400 kHz; and 1, 2, and 4 MHz.

9. A group delay time measurement apparatus comprising:
 means for inputting a signal to be measured;
 local oscillating means for oscillating a local oscillation signal having a predetermined frequency;
 frequency converting means for receiving the signal to be measured supplied from said signal input means and the local oscillation signal supplied from said local oscillating means and outputting an intermediate frequency signal;
 phase detecting means, connected to said frequency converting means, for detecting a phase of the intermediate frequency signal;
 analog to digital converting means for receiving a phase detection output supplied from said phase detecting means and outputting a corresponding digital value;
 aperture value storage means for storing a plurality of aperture values, each of the aperture values being read out by a predetermined frequency band which is incremented at a predetermined step, respectively;
 measurement frequency setting means for setting a desired measurement frequency;
 first control means for receiving an aperture value from said aperture value storage means and the desired measurement frequency from said measurement frequency setting means and causing said local oscillating means to oscillate signals having first and second frequencies, the signals being separated from each other by the aperture value in the vicinity of the desired measurement frequency;
 arithmetic means, coupled to said analog to digital converting means, for calculating a phase difference in accordance with two digital values which correspond to respective phase detection outputs supplied from said phase detecting means when said local oscillating means oscillates the signals having the first and second frequencies;
 determination means for determinating whether an absolute value of the phase difference output from said arithmetic means is larger than $\pi$; and
 second control means, coupled to said measurement frequency setting means and said determination means, for causing said aperture value storage means to start reading and incrementing the aperture value in accordance with the desired measurement frequency at the time of initialization and when a determination result concerning the phase difference has been determined to be smaller than $\pi$, and causing said aperture value storage means to stop reading and incrementing the aperture value when a determination result concerning the phase difference has been determined to be larger than $\pi$.

10. An apparatus according to claim 9, wherein the aperture value stored in said aperture storage means is incremented as an exponential of 2.

11. An apparatus according to claim 9, wherein said second control means includes a repetitive counter which is set at zero upon initialization and is sequentially incremented.

12. An apparatus according to claim 9, wherein said apparatus further comprises:
 data processing means for receiving an output from said arithmetic means and performing predetermined processing; and
 display means for displaying an output from said data processing means.

13. An apparatus according to claim 12, wherein the desired measurement frequency set by said measurement frequency setting means is obtained by setting a frequency reading marker point at a peak value of a curve displayed on said display means and represents the measurement signal.

14. An apparatus according to claim 9, wherein the first and second frequencies oscillated by said local oscillating means are $f_0 - \Delta F/2$ and $f_0 + \Delta F/2$, respectively, where $f_0$ is the measurement frequency and $\Delta F$ is the aperture value.

15. An apparatus according to claim 9, wherein the aperture value includes 1, 2, 4, 10, 20, 40, 100, 200, and 400 Hz; 1, 2, 4, 10, 20, 40, 100, 200, and 400 kHz; and 1, 2, and 4 MHz.

* * * * *